(12) United States Patent
Roth

(10) Patent No.: US 8,761,224 B2
(45) Date of Patent: Jun. 24, 2014

(54) COMPOUND ENCLOSURE FOR OPTICAL APPARATUS

(75) Inventor: Matthias Roth, Sunnyvale, CA (US)

(73) Assignee: Coherent, Inc., Santa Clara, CA (US)

(*) Notice: Subject to any disclaimer, the term of this patent is extended or adjusted under 35 U.S.C. 154(b) by 126 days.

(21) Appl. No.: 13/433,119

(22) Filed: Mar. 28, 2012

(65) Prior Publication Data
US 2013/0259076 A1  Oct. 3, 2013

(51) Int. Cl.
*H01S 3/091* (2006.01)
*H01S 3/092* (2006.01)
*H01S 3/08* (2006.01)

(52) U.S. Cl.
USPC .............................................. 372/70; 372/92

(58) Field of Classification Search
USPC .......................................... 372/70, 43.01, 92
See application file for complete search history.

(56) References Cited

U.S. PATENT DOCUMENTS

| 5,140,466 | A | | 8/1992 | Parker |
| 5,181,214 | A | * | 1/1993 | Berger et al. ................... 372/34 |
| 5,329,539 | A | * | 7/1994 | Pearson et al. .................. 372/36 |
| 5,930,600 | A | | 7/1999 | Seelert et al. |
| 6,097,742 | A | | 8/2000 | Caprara et al. |
| 7,502,399 | B2 | * | 3/2009 | Ferstl ......................... 372/38.01 |
| 7,952,806 | B2 | | 5/2011 | Callen et al. |

\* cited by examiner

*Primary Examiner* — Armando Rodriguez
(74) *Attorney, Agent, or Firm* — Morrison & Foerster LLP

(57) ABSTRACT

An optically pumped semiconductor laser is assembled in an enclosure comprising a base, a first mounting frame attached to the base, a second mounting frame attached to the first mounting frame and a cover attached to the second mounting frame. The assembly base, frames, and cover forms an undivided enclosure, with the frames contributing to walls of the enclosure. Components of the laser are assembled sequentially on the base and the frames. The frames are irregular in height to permit flexibility in the mounting-height of components. This reduces the extent to which compactness of the enclosure is limited by any one component.

14 Claims, 7 Drawing Sheets

COMPOUND ENCLOSURE FOR OPTICAL APPARATUS

TECHNICAL FIELD OF THE INVENTION

The present invention relates in general to enclosures for housing optical apparatus or electro-optical apparatus. The invention relates in particular to enclosures for housing laser apparatus.

DISCUSSION OF BACKGROUND ART

Laser apparatus is usually part of an optical system for performing some operation using the laser apparatus. Such operations include laser machining, optical inspection of semiconductor circuits, interferometry, and microscopy. Because of this, there is a constant demand to reduce the size of laser apparatus, for example, for correspondingly reducing the size, or for increasing the portability of the overall optical system.

One approach to reducing the size of laser apparatus is described in U.S. Pat. No. 7,952,806, assigned to the assignee of the present invention and the complete disclosure of which is hereby incorporated by reference. In this apparatus the output of four semiconductor lasers, each emitting radiation of a different color is combined to provide illumination for microscopy. The apparatus is housed in an enclosure divided into three compartments arranged one above another. Lasers are located in a base compartment, electronics are located on the floor of the next compartment, and a beam combining arrangement including a compact, monolithic, pentagonal beam-combining prism is mounted on the floor of the upper compartment.

A limit to compactness in this arrangement is that the area of footprint of the enclosure is determined by the area required of the biggest compartment. Vertical floor-spacing is determined by the tallest compartment on any one floor. In order to achieve any further compacting, a more flexible approach to such housing or packaging is required.

SUMMARY OF THE INVENTION

The present invention is directed to compact packaging of optical apparatus in an enclosure, the optical apparatus including a plurality of components. In one aspect of the invention the enclosure comprises a base-member, configured to provide a floor of the enclosure. One or more open frame-members are stacked on the base-member and form walls of the enclosure. A cover-member covers the enclosure. At least one of the components is mounted on one of the one or more frame-members.

In another aspect of the invention optical apparatus includes a plurality of optical components contained in a housing having an undivided internal volume. The housing includes a rigid base and a rigid wall. At least one the optical components is mounted on the rigid wall.

The term components as applied to the optical apparatus is intended to include but not be limited to optical components such as lenses, minors, solid-state gain-media and semiconductor gain-structures, and optically nonlinear crystals for frequency conversion; electro-optical components such as semiconductor-lasers, detectors, Q-switches, and optical modulators; and mechanical components such as optical mounts.

In one preferred embodiment of the invention, the optical apparatus is a frequency-doubled optically pumped semiconductor (OPS) laser having a multiply-folded resonator. The enclosure or housing has two frame-members. Components of the laser are mounted on the base-member and each of the two frame-members.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
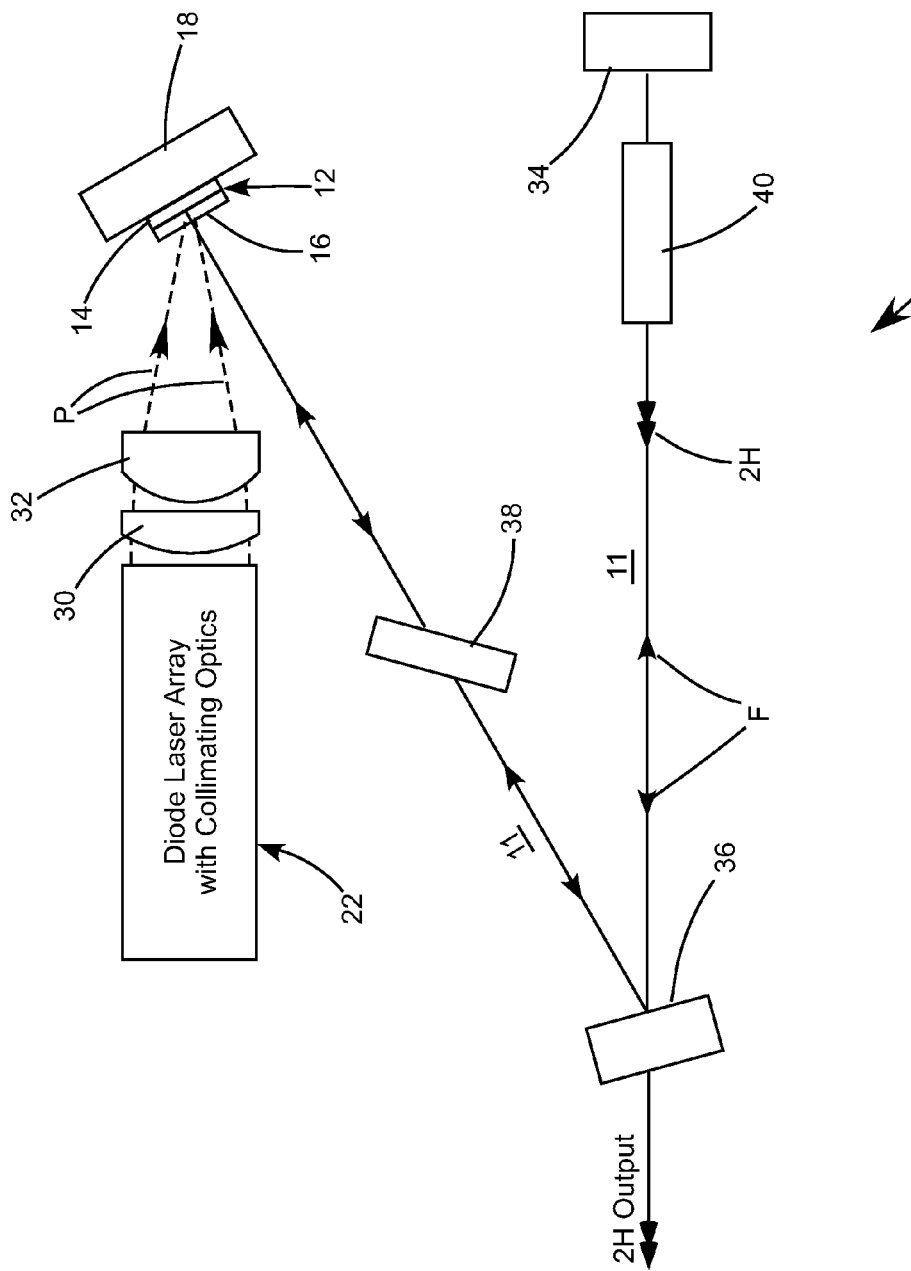
FIG. 1 schematically illustrates a prior-art, planar layout of an intra-cavity frequency-doubled optically pumped semiconductor (OPS) laser including a semiconductor gain-structure, a diode-laser array and associated optics for pumping the gain-structure, a resonator including an optically nonlinear crystal for the frequency-doubling, an end mirror and a dichroic fold-mirror for outputting frequency-doubled radiation, and a birefringent filter for selecting the wavelength of radiation to be frequency-doubled.

Referring now to the drawings, wherein like components are designated by like reference numerals, FIG. 1 schematically illustrates a prior-art, planar layout of an intra-cavity frequency-doubled optically pumped semiconductor (OPS) laser 10 having a laser-resonator 11. Laser 10 includes an OPS structure 12 including a mirror structure 14 surmounted by a semiconductor gain-structure 16. The OPS structure is supported on a heat-sink 18. Gain structure 16 is optically pumped by radiation P from a diode-laser array 22 including fast- and slow-axis collimating optics (not shown in FIG. 1). Here, the collimated pump radiation is focused onto the gain-structure by lenses 30 and 32.

Laser-resonator 11 is formed between mirror structure 14 of the OPS structures and an end-mirror 34. The resonator is once-folded by a fold-mirror 36 for compactness and convenience of output. In response to the optical pumping of gain-structure 16, radiation having a fundamental wavelength characteristic of materials of the gain-structure circulates in resonator 11 as indicated by arrowheads F. A birefringent filter 38 is configured to select a particular fundamental wavelength from a relatively broad gain-bandwidth of the gain-structure. An optically nonlinear crystal 40 converts the fundamental radiation to second-harmonic (2H) radiation by frequency-doubling. The 2H-radiation is indicated in FIG. 1 by double arrowheads 2H. Fold-mirror 36 is a dichroic mirror, highly reflective for the fundamental radiation and highly transmissive for the 2H radiation. This allows the 2H radiation be delivered from resonator 11 as output radiation.

It should be noted here that only sufficient description of laser 10 is provided to explain how such a laser and other optical apparatus can be packaged in an enclosure in accordance with the present invention. A detailed description of such a laser is not required for understanding principles of the present invention and accordingly is not presented herein. A detailed description of OPS lasers including frequency-doubled such lasers is provided in U.S. Pat. No. 6,097,742, assigned to the assignee of the present invention, and the complete disclosure of which is hereby incorporated herein by reference.

The present invention is described below with an example of repackaging the prior-art laser of FIG. 1 into an inventive compound enclosure of the type summarized above. The description begins with reference to FIG. 2 which schematically illustrates a base-member 42, here, a rectangular base-member, of the enclosure. Base-member 42, here has low side-walls 44A and 44B, an end-wall 46A having the same height as the side-walls and a raised, thickened end-wall 46B. These walls surround a rigid floor 48 of the base-member.

The purpose of the low walls is primarily to provide sufficient thickness for blind threaded holes (not shown) which could be used for attaching other enclosure members. These low walls also contribute to providing rigidity of base-member 42. End-wall 46B is raised and thickened to allow the end-wall to be machined to provide a mount for OPS-structure 12. The wall is machined at an angle to the floor of the base member and at an angle to the longitudinal direction of the base-member to satisfy a particular fold arrangement of the laser-resonator.

Diode-laser array assembly 20 is attached to floor 48 of the base-member. The diode laser bar assembly includes a heat-sink 22 and a top-contact 24. The actual diode-laser array (diode-laser bar) is not visible as it is clamped between the heat-sink and the top contact and obscure by a collimating optics assembly 26, which includes a cylindrical, fast-axis collimating lens 27 and an array of slow-axis collimating lenses 28. Diode-laser array assemblies, with collimating optics of this type, are commercially available from a number of commercial suppliers.

Focusing lenses 30 and 32 are supported on a mount 50 including a platform 52 to which the lenses are bonded. Platform 52 is bonded to floor 48 via a positive temperature coefficient (PTC) heating element 54. This type of mounting device uses the PTC element to soften solder bonds, allowing the optics (here lenses 30 and 32) to be aligned. After alignment the PTC element is allowed to cool to harden the solder bonds to fix the alignment. This type of mount is well known in the laser art and is described in detail in U.S. Pat. No. 5,930,600, assigned to the assignee of the present invention, and the complete disclosure of which is hereby incorporated herein by reference. Other type of optics mount may be used for these or other components of the re-packaged laser without departing from the spirit and scope of the present invention.

Figure 2:
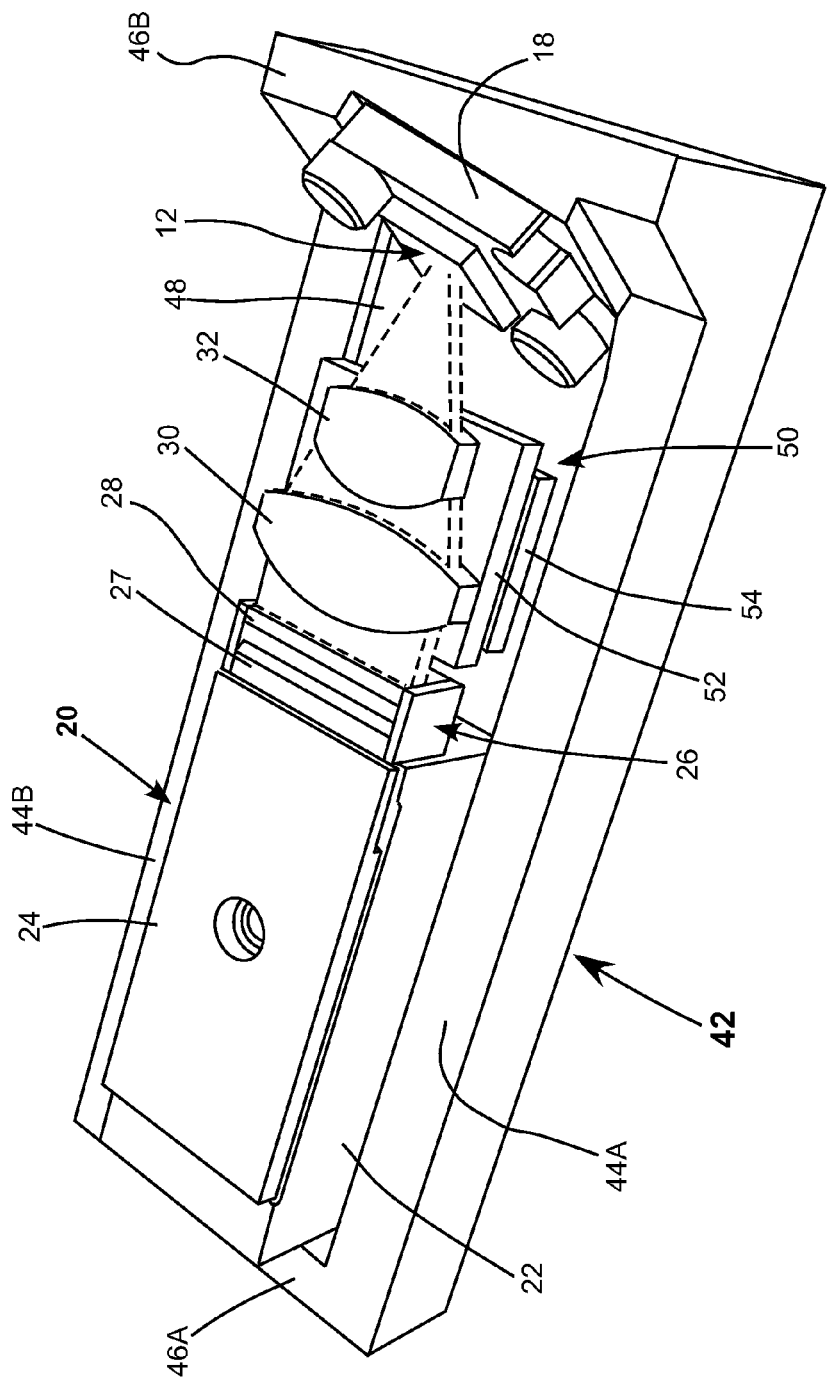
FIG. 2 is a three-dimensional perspective view schematically illustrating a base-member of an optical apparatus enclosure in accordance with the present invention wherein the optical apparatus is an intra-cavity frequency-doubled OPS-laser including components of the laser of FIG. 1, with the semiconductor gain-structure, and the diode-laser array and associated optics for pumping the gain-structure, mounted on the base-member.
Figure 3:
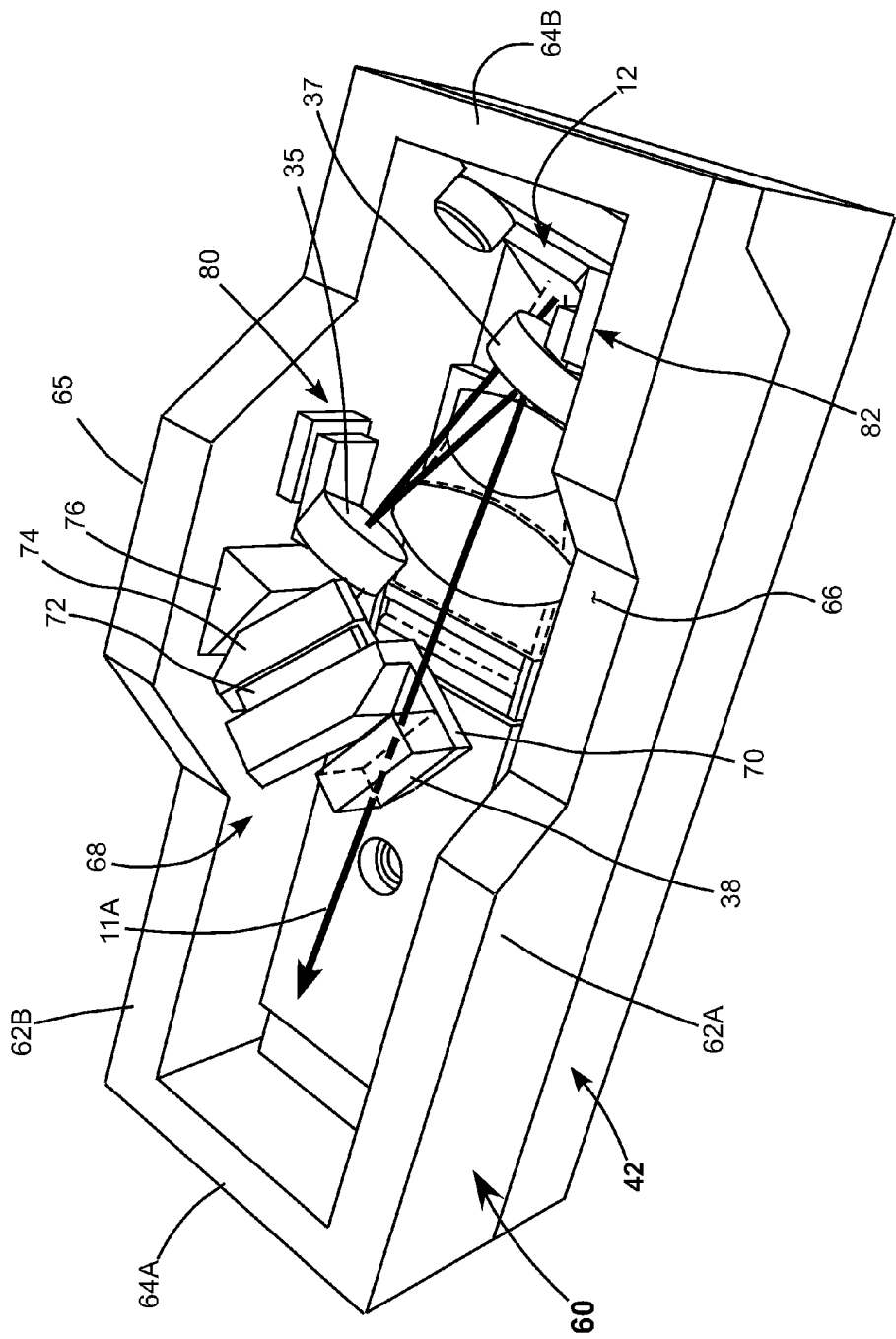
FIG. 3 is a three-dimensional perspective view schematically illustrating a first frame-member attached to the base member of FIG. 2, with the birefringent filter and a first auxiliary fold-minor, mounted on one side-wall of the first frame-member and a second auxiliary fold-mirror, mounted on an opposite side-wall of the first frame-member.

FIG. 3 schematically illustrates a first rigid frame-member 60, here, rectangular, attached to the base-member 42 of FIG. 2 in a next step of assembling the laser, and the enclosure. In FIG. 3, only components added to those depicted in FIG. 2 are identified, for simplicity of illustration, the previously described components being easily recognizable due to the detail level of the drawings.

Frame-member 60 includes opposite side-walls 62A and 62B, and opposite end-walls 64A and 64B. The frame-member is an "open", frame, i.e., the frame does not have a floor.

Birefringent filter (BRF) 38 of the laser is mounted on a raised portion 65 of wall 62B via a complex mount 68. A lowered region 66 of wall 62A facilitates access to mount 68 for aligning and adjusting the birefringent filter. Mount 68 includes a bracket 70 on which the BRF is bonded. Bracket 70 is bonded to an intermediate member 74 via a temperature control element 72, for example a thermoelectric coupler. Intermediate member 74 is bonded to a base member 76 which is affixed to, or alternatively part of, wall 62B. Base member 76 has a triangular cross-section which establishes the incidence angle for the BRF at the Brewster angle. Adjustment of the transmission wavelength of the BRF is made by adjusting the angle of the optical axis of the BRF relative to the polarization plane of the resonator mode.

Fold-mirrors 35 and 37 are provided for the laser-resonator. Mirrors 35 and 37 are attached to walls 62B and 62A, respectively, by mounts 80 and 82, respectively. These mounts are of the PTC type discussed above. The resonator beam-path is indicated by a bold line 11A. It can be seen from the drawing that a beam of radiation leaving OPS chip 12 is incident first on mirror 35 and next on mirror 37. Mirror 37 directs the beam through BRF 38 to other resonator components (not shown) which are (or will be) attached to another frame-member. Fold mirrors 35 and 37 and the BRF are aligned with respect to OPS-structure 12, i.e., with respect to mirror-structure 14 thereof. Techniques for performing such alignment are well known in the art and include the use of visible alignment lasers, pinholes and other fixtures.

Figure 4:
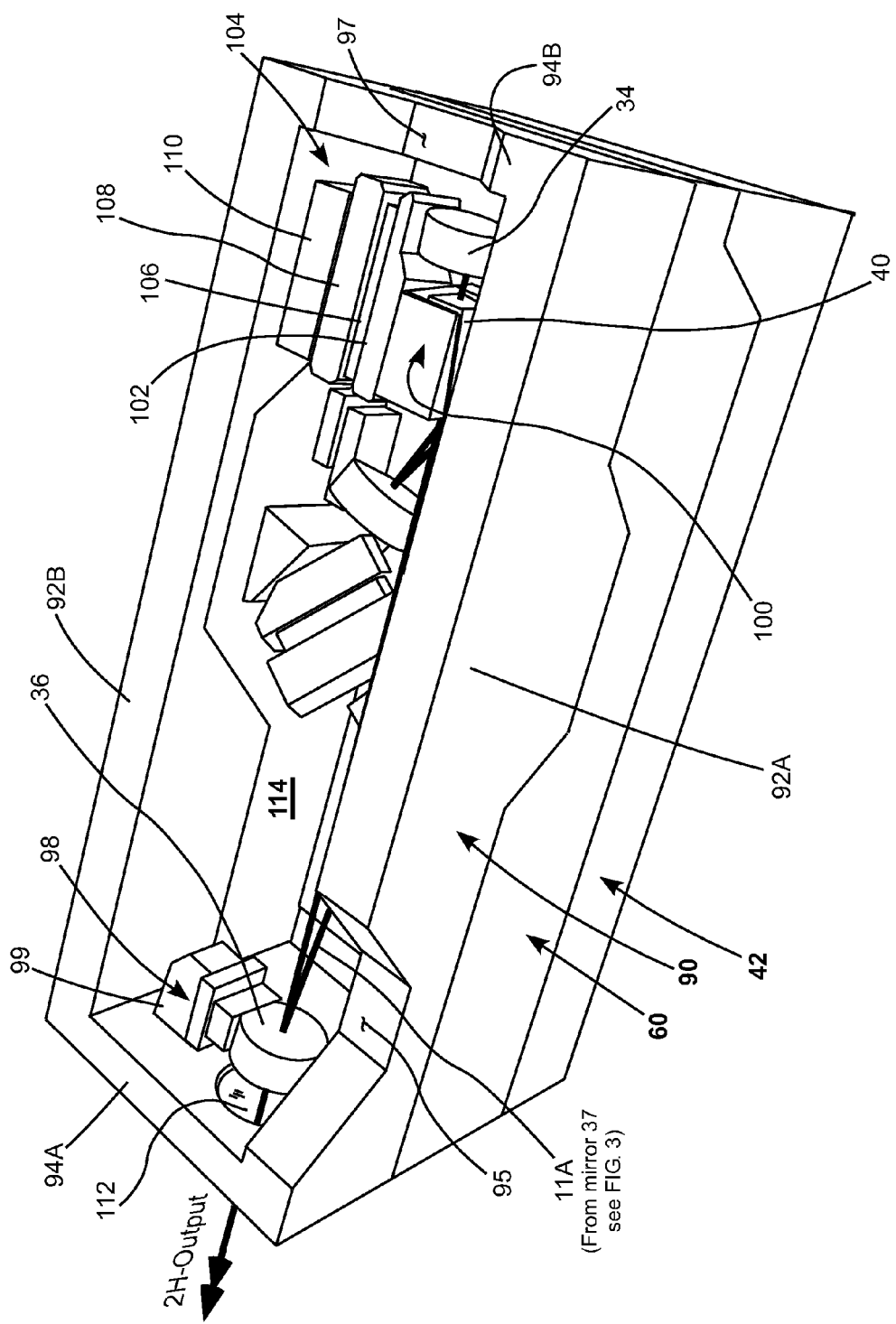
FIG. 4 is a three-dimensional perspective view schematically illustrating a second frame-member attached to the first frame-member of FIG. 3, with the optically nonlinear crystal mounted a one side-wall of the second frame-member, the resonator end-mirror mounted on an opposite side-wall of the second frame member, and the dichroic minor mounted on an end-wall of the second frame-member.

FIG. 4 schematically illustrates a second rigid frame-member 90 attached to frame-member 60 of FIG. 3 in a next step of assembling the laser, and the enclosure. Here again, only components added to those depicted in FIG. 3 are identified, for simplicity of illustration.

Frame-member 90 includes opposite side-walls 92A and 92B, and opposite end-walls 94A and 94B. Here again, the frame-member is an "open", frame. Cut-out portions 95 and 97 are provided in walls 92A and 94B respectively to facilitate access for component mounting and alignment. Dichroic mirror 36 is mounted on end-wall via a PTC type mount 98 on a bracket or post 99. Mirror 36 directs fundamental radiation in the laser beam-path 11A back through optically nonlinear crystal 40 to resonator end mirror 34.

Crystal 40 is held in a C-shaped, thermal contact clamp 100, which is bonded to a platform or holder 102. Holder 102 is supported on a mount 104 including a heating element 106 for maintaining the crystal at a phase-matching temperature. The mount comprises a base 108, and a post 110, which is attached to wall 92B.

Figure 4A:
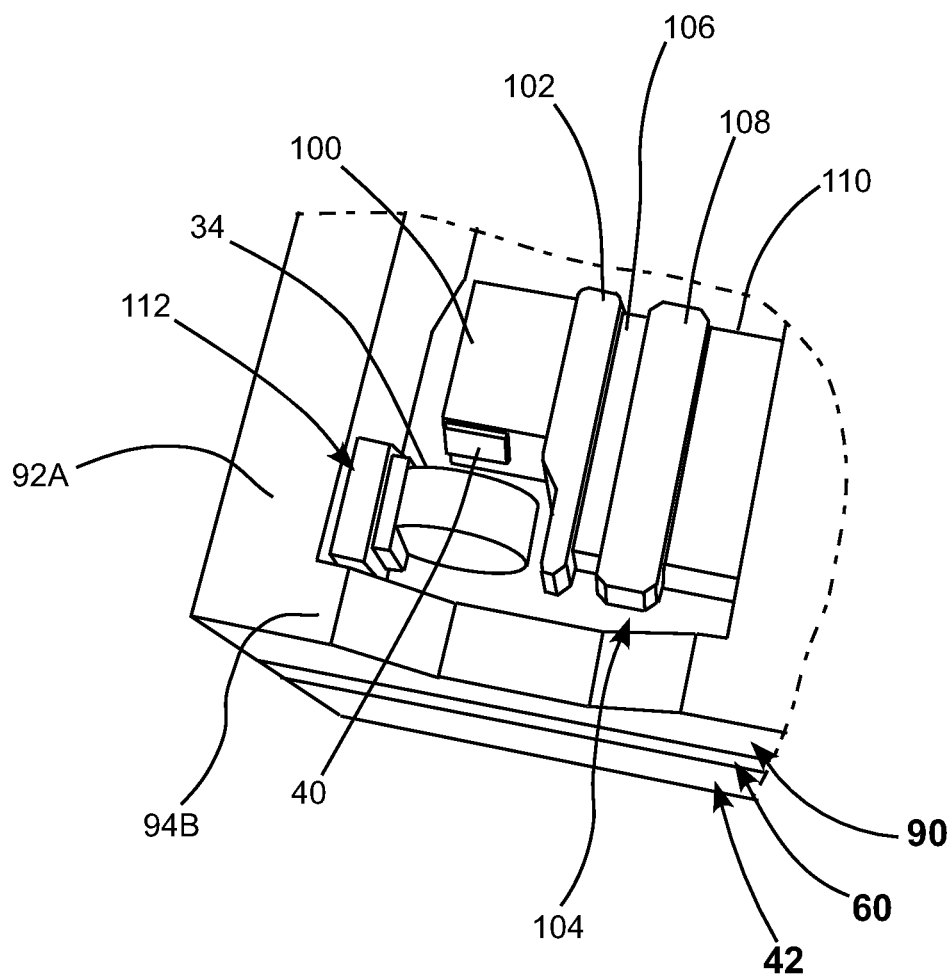
FIG. 4A is a three-dimensional perspective view schematically illustrating further detail of the mounting of the optically nonlinear crystal and the resonator end-mirror in the frame members of FIG. 4.
Figure 4B:
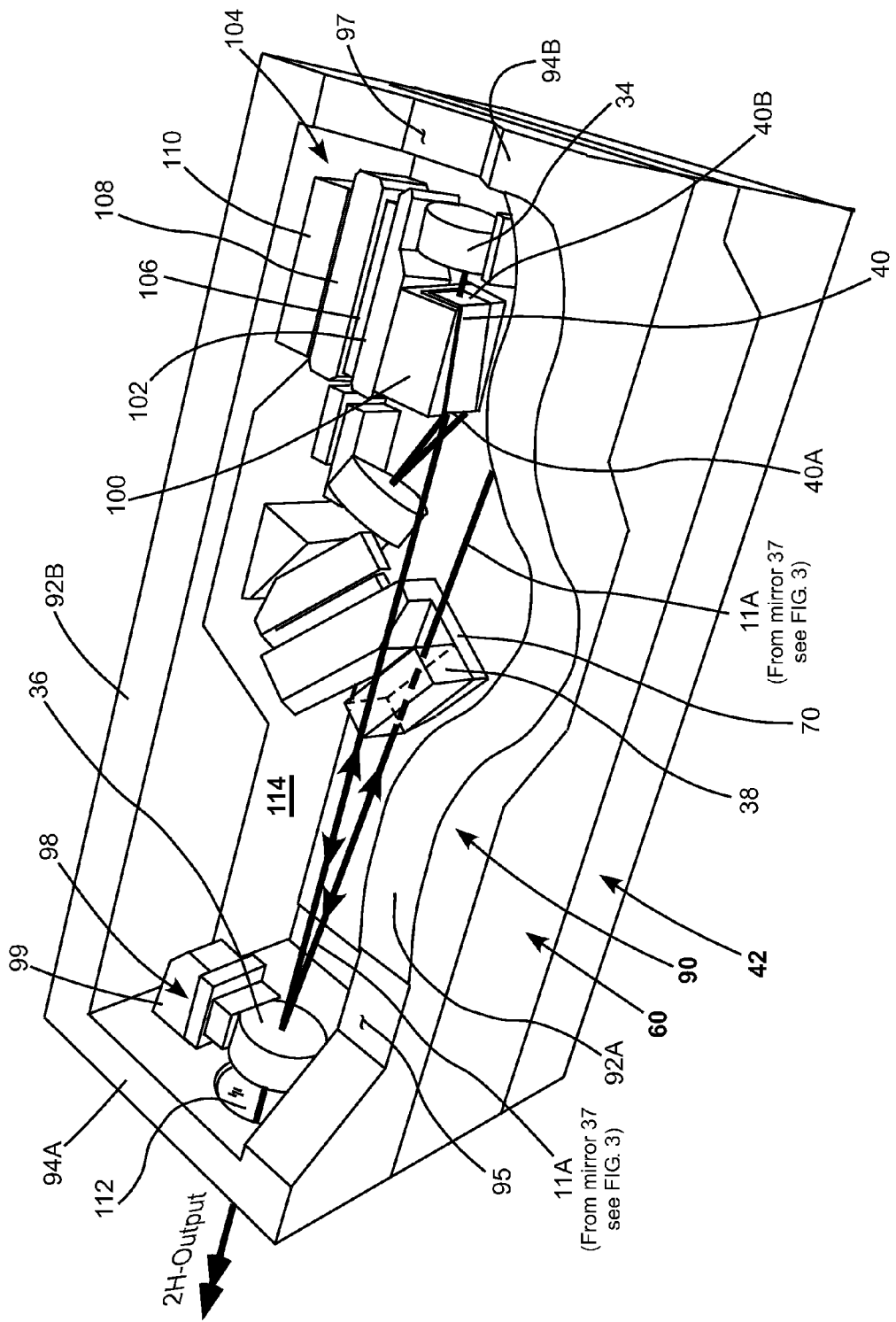
FIG. 4B is a three-dimensional perspective view schematically illustrating still further detail of the mounting of the optically nonlinear crystal and the resonator end-mirror in the frame members of FIG. 4.

Referring now to FIG. 4A and FIG. 4B for detail, resonator end-mirror 34 is mounted on wall 92A via a PTC-type mount 112. The resonator functions as described above for the laser of FIG. 1. 2H-radiation generated by crystal 40 is transmitted through dichroic minor 36 and a window 112 in wall 94A of frame-member 90 as output radiation of the laser.

Referring in particular to FIG. 4B wherein wall 92A of frame-member 90 is depicted as cut-away to provide visibility, crystal 40 is inclined at an angle to beam path 11A with end faces 40A and 40B of the crystal cut for optimum phase-matching. Here, the beam from dichroic mirror 36 is incident on crystal 40 via end-face 40A; is refracted by the surface along the longitudinal axis of the crystal; and exits end-face 40B thereof parallel to the incidence direction. The beam is returned by reflection from end-mirror 34 along the same path. Cutting and orientation of optically nonlinear crystals for phase matching in frequency conversion is well known in the art and a detailed description thereof is not required for understanding principles of the present invention accordingly no such description is presented herein.

Figure 5:
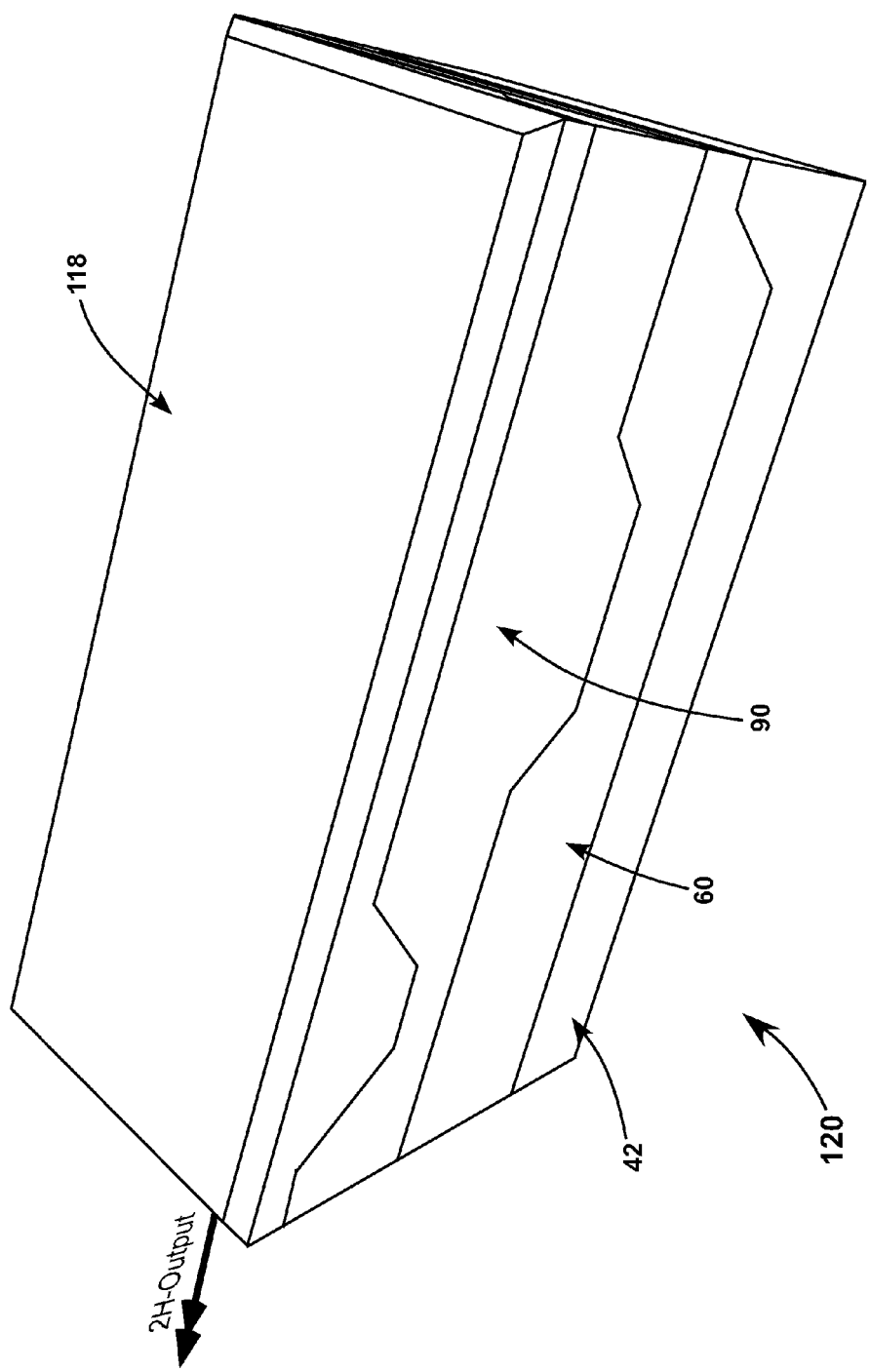
FIG. 5 is a three-dimensional perspective view illustrating a cover-member attached to the second frame-member of FIG. 4 for completing the enclosure.

At the point depicted in FIG. 4, the assembly of the laser is complete, and the base and frame-members have formed an almost-complete enclosure 114 for the laser. The enclosure is completed as schematically depicted in FIG. 5 by a cover-member 118 to provide an inventive laser 120 in what is essentially an integral enclosure.

Those skilled in the art will recognize that base and frame-members must be stiff enough to hold components of the laser in relative alignment as components are added and frame-members are attached to each other to form the enclosure. Accordingly, materials such as aluminum titanium and magnesium with a high stiffness to weight ratio are preferred for forming the base and frame-members. Composite materials may also be considered. Regarding attaching the base and frame-members together, options include the use of screws attaching one member to the next, or bonding or welding the members together, if maintenance of the laser is not contemplated. These or any such options may be exercised without departing from the spirit and scope of the present invention.

One unique aspect of the present invention is that the laser and the enclosure thereof are actually assembled together, step by step. This differs significantly from normal practice where all components are assembled on a stiff base then covered with a can-type enclosure. The use of a sequence of open frame-members for forming the enclosure, in addition to providing sites for component mounting, optimizes the use of the undivided volume of the enclosure for compactly arranging, in this case, the laser, and generally any other optical system.

In practice, an optical system can be theoretically folded into the smallest practical volume in space, and then a compound enclosure in accordance with the present invention can be designed specifically for that system to enclose that volume. This promises a significant advance in the quest to reduce the size of optical systems.

By way of example, the OPS-laser described herein would have performance comparable to a Genesis-MX™ laser available from Coherent Inc. of Santa Clara, Calif., the assignee of the present invention. This laser has a 2H-output power of up to about 8 Watts (W), and is contained in an enclosure having dimensions 4.75 inches by 1.73 inches by 2.75 inches. The inventive enclosure for the laser described above can, in theory at least, have corresponding dimensions 2.17 inches by 0.79 inches by 1.1 inches, i.e., less than half of the linear dimensions and about one-tenth of the volume. These dimensions may need to be increased to accommodate heat dissipation measures. Nevertheless the reduction in size and volume can still be expected to be commercially significant.

It is emphasized here that while the present embodiment is described above with reference to assembling a frequency-doubled OPS-laser in the inventive disclosure, the invention enclosure and assembly technique is applicable to assembling any multi-component optical apparatus active or passive for which requires or would benefit from an enclosure. In summary, the invention is not limited to the embodiment described above. Rather the invention is defined by the claims appended hereto.

What is claimed is:

1. Optical apparatus, the optical apparatus including a plurality of optical components and being contained in an enclosure comprising:
   a base-member, configured to provide a floor of the enclosure;
   two or more open rigid frame-members forming four walls of the enclosure, with a first frame-member stacked on the base member, and a second frame-member stacked on the first frame-member;
   a cover-member covering the enclosure; and
   wherein at least one of the optical components of the apparatus is mounted on the interior surface of a frame-member.

2. Optical apparatus, the optical apparatus including a plurality of optical components and being contained in an enclosure comprising:
   a base-member, configured to provide a floor of the enclosure;
   one or more open rigid frame-members forming four walls of the enclosure, with a first frame-member stacked on the base member;
   a cover-member covering the enclosure;
   a laser-resonator formed by at least two mirrors;
   a gain-medium within the laser-resonator; and
   a diode-laser array for optically pumping the gain-medium,
   wherein at least one of the optical components of the apparatus is mounted on the interior surface of a frame-member.

3. The apparatus of claim 2, wherein the diode-laser array is attached to the base member, and at least one of the resonator minors is attached to the interior surface of a frame member.

4. The apparatus of claim 1, wherein the optical apparatus is an intra-cavity doubled optically pumped semiconductor (OPS) laser having an OPS-structure including a gain-structure surmounted by a mirror-structure, a laser-resonator formed between the minor-structure of the OPS-structure and an end-mirror, the resonator being thrice-folded by first and second fold-minors and a dichroic output-mirror; an optically nonlinear crystal being located in the laser-resonator for the frequency-doubling; and a diode-laser array package including collimating and focusing optics for optically pumping the gain-structure.

5. The apparatus of claim 4, wherein diode-laser array package and the OPS-structure are attached to the base member; the first and second fold-minors are attached to the interior surface of the first frame-member; and the dichroic minor and the end-mirror are attached to the interior surface of the second frame-member.

6. The apparatus of claim 1 where the component is mounted on the frame member via an optical mount.

7. Optical apparatus, the optical apparatus including a plurality of optical components, the apparatus comprising:
   a housing having an undivided internal volume, and containing the optical components, the housing including a rigid base and a rigid wall, with at least one of the optical components being mounted on the interior surface of the rigid wall, wherein the housing is formed from a first housing member forming the rigid base and a second housing-member attached to the base and forming a first part of the rigid wall, and wherein the housing further includes a third housing-member attached to the second housing-member and forming a second part of the rigid wall.

8. The apparatus of claim 7, wherein the optical apparatus is an intra-cavity doubled optically pumped semiconductor (OPS) laser having an OPS-structure including a gain-structure surmounted by a mirror-structure, a laser-resonator formed between the minor-structure of the OPS-structure and an end-mirror, the resonator being thrice-folded by first and second fold-minors and a dichroic output-mirror; an optically nonlinear crystal being located in the laser-resonator for the frequency-doubling; and a diode-laser array package including collimating and focusing optics for optically pumping the gain-structure.

9. The apparatus of claim 8, wherein diode-laser array package and the OPS-structure are attached to the first housing member; the first and second fold-mirrors are attached to the interior surface of the second housing-member; and the dichroic mirror and the end-mirror are attached to the interior surface of the third housing-member.

10. The apparatus of claim 9, further including a fourth housing-member attached to the third housing member and forming a cover of the enclosure.

11. The apparatus of claim 7, wherein the housing has a rectangular base and rectangular walls.

12. A method of assembling an optically pumped semiconductor (OPS) laser, said OPS laser including a semiconductor chip mounted on a first end mirror, a laser diode array for pumping the semiconductor chip, wherein said semiconductor chip is located within a resonator that includes the first end minor associated with the chip and a spaced apart second end minor and further including a birefringent filter and a non-linear crystal, said resonator being folded by a dichroic minor, said method comprising the steps of:

mounting the laser diode array and the semiconductor chip on a rigid base;

mounting a first rigid frame to the rigid base, said first rigid frame having four walls;

mounting the birefringent filter to the interior surface of one of the walls of the first rigid frame;

mounting a second rigid frame to the first rigid frame said second rigid frame having four walls; and mounting the non-linear crystal, second end minor and dichroic mirror each to the interior surface of a different wall of the second rigid frame.

13. A method as recited in claim 12 wherein the wall of the first frame opposite said one wall is provided with a reduced height portion aligned with the birefringent filter.

14. A method as recited in claim 12 the second frame is provided two reduced height portions located in a manner to permit access to the second end mirror and the dichroic minor respectively.

* * * * *